(12) United States Patent
Karlstedt

(10) Patent No.: US 9,303,902 B2
(45) Date of Patent: Apr. 5, 2016

(54) THERMOELECTRIC ASSEMBLY

(71) Applicant: Laird Technologies, Inc., Earth City, MO (US)

(72) Inventor: Dan Martin Gustav Karlstedt, Torslanda (SE)

(73) Assignee: Laird Technologies, Inc., Earth City, MO (US)

( * ) Notice: Subject to any disclaimer, the term of this patent is extended or adjusted under 35 U.S.C. 154(b) by 244 days.

(21) Appl. No.: 13/838,832

(22) Filed: Mar. 15, 2013

(65) Prior Publication Data

US 2014/0260330 A1 Sep. 18, 2014

(51) Int. Cl.
*F25B 21/04* (2006.01)
*F25B 21/02* (2006.01)

(52) U.S. Cl.
CPC .......... *F25B 21/02* (2013.01); *F25B 2321/0251* (2013.01); *H01L 2924/0002* (2013.01)

(58) Field of Classification Search
CPC ............ F25B 21/04; H01L 2924/0002; H01L 2924/00
USPC .......................... 62/3.2, 3.3, 3.7; 136/204, 205
See application file for complete search history.

(56) References Cited

U.S. PATENT DOCUMENTS

| | | | | | |
|---|---|---|---|---|---|
| 4,463,569 | A | * | 8/1984 | McLarty | 62/3.2 |
| 5,315,830 | A | * | 5/1994 | Doke et al. | 62/3.2 |
| 5,841,064 | A | * | 11/1998 | Maekawa et al. | 136/203 |
| 6,058,712 | A | * | 5/2000 | Rajasubramanian et al. | 62/3.6 |
| 6,530,231 | B1 | * | 3/2003 | Nagy et al. | 62/3.2 |
| 6,625,990 | B2 | * | 9/2003 | Bell | 62/3.3 |
| 6,800,933 | B1 | | 10/2004 | Mathews et al. | |
| 6,946,600 | B1 | | 9/2005 | Stoller | |
| 7,278,270 | B2 | * | 10/2007 | Culp et al. | 62/3.6 |
| 7,337,615 | B2 | * | 3/2008 | Reidy | 62/3.4 |
| 7,466,553 | B2 | * | 12/2008 | Hamman | 361/718 |
| 7,475,551 | B2 | * | 1/2009 | Ghoshal | 62/3.2 |
| 7,866,164 | B2 | * | 1/2011 | Rice | 62/3.3 |
| 7,929,294 | B2 | | 4/2011 | Yeh et al. | |
| 8,418,477 | B2 | * | 4/2013 | Klein et al. | 62/3.61 |
| 8,490,413 | B2 | * | 7/2013 | Blackway et al. | 62/3.62 |
| 8,499,575 | B2 | * | 8/2013 | Nicolai et al. | 62/259.2 |
| 8,742,246 | B2 | * | 6/2014 | Toyoda et al. | 136/208 |
| 2002/0092307 | A1 | | 7/2002 | Ghoshal | |
| 2003/0145605 | A1 | * | 8/2003 | Moon et al. | 62/3.2 |
| 2004/0134200 | A1 | * | 7/2004 | Schroeder et al. | 62/3.7 |
| 2007/0012049 | A1 | * | 1/2007 | Chen | 62/3.2 |

(Continued)

FOREIGN PATENT DOCUMENTS

JP 2008-198928 8/2008

OTHER PUBLICATIONS http:www.rittal.com/products/industrial-enclosures/product-portfolio/index.html; Mar. 15, 2013; 2 pages.

(Continued)

*Primary Examiner* — Mohammad M Ali
(74) *Attorney, Agent, or Firm* — Harness, Dickey & Pierce, P.L.C.

(57) ABSTRACT

A thermoelectric assembly is disclosed, the assembly having a cold side and a hot side, where each of the hot side and cold side comprises a fan sink. Thermoelectric modules may be between the hot side and cold side and arranged in one circuit or multiple parallel circuits, and in direct thermal contact with both the hot side and the cold side. Each of the hot side and cold side has an air intake direction and an exhaust direction.

19 Claims, 10 Drawing Sheets

(56) References Cited

U.S. PATENT DOCUMENTS

| | | |
|---|---|---|
| 2007/0035928 A1 | 2/2007 | Hamman |
| 2007/0119186 A1* | 5/2007 | Kitchens et al. ............... 62/3.3 |
| 2009/0301103 A1* | 12/2009 | Bell .................. F25B 21/02 62/3.7 |
| 2011/0017252 A1* | 1/2011 | Braun et al. ............... 136/204 |
| 2011/0197598 A1 | 8/2011 | Cheng et al. |
| 2012/0192574 A1* | 8/2012 | Ghoshal et al. ............... 62/3.2 |

OTHER PUBLICATIONS

Thermoelectric Products Catalogu 2012; 32 pages.
International Search Report and Written Opinion issued for PCT International Application No. PCT/US2013/074646 dated Mar. 31, 2014, which claims priority to the instant application; 12 pages.

* cited by examiner

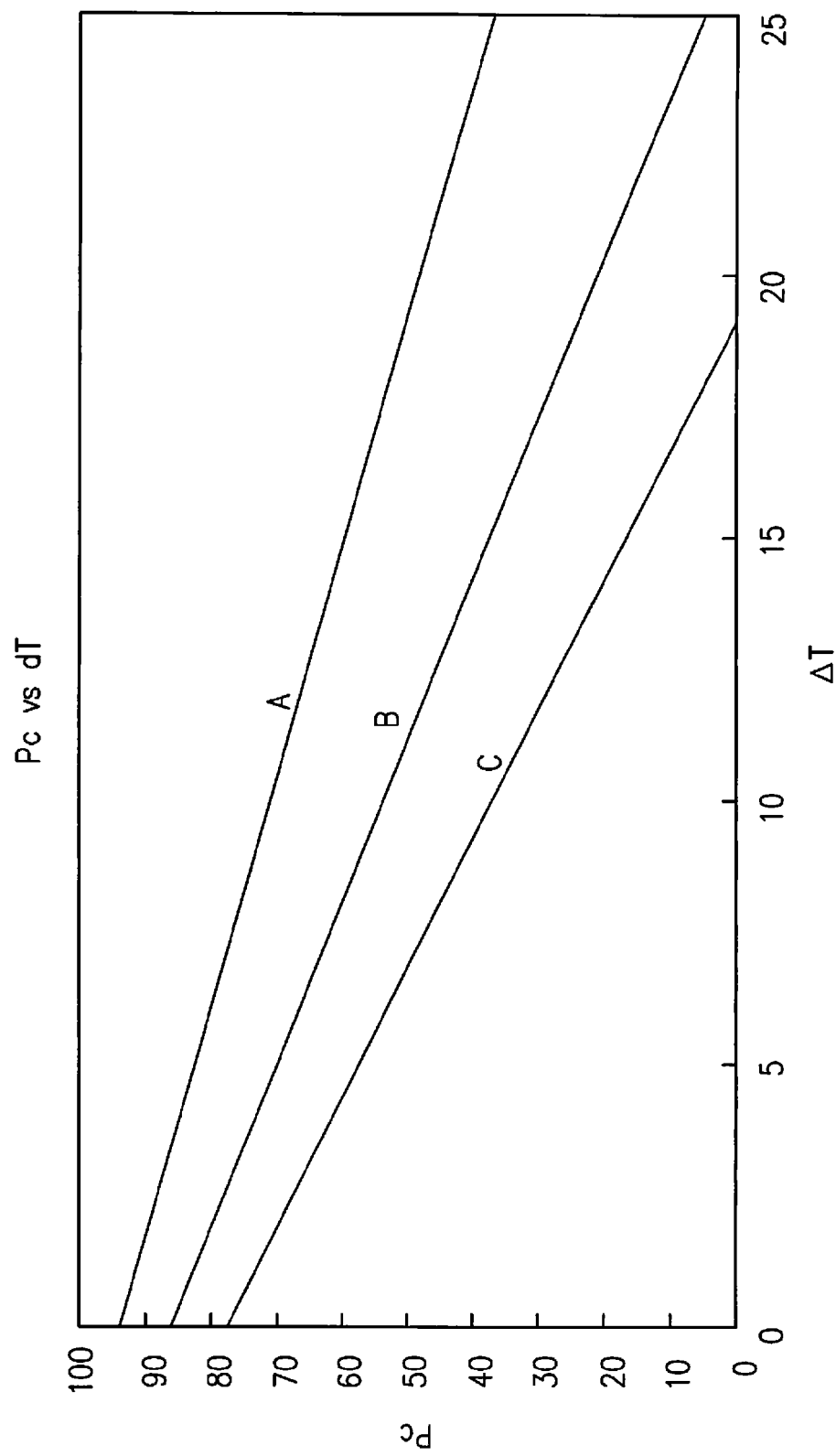

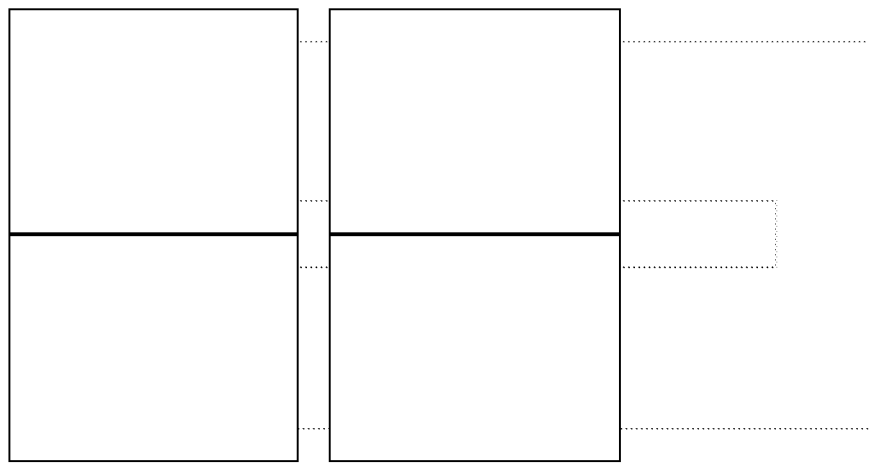
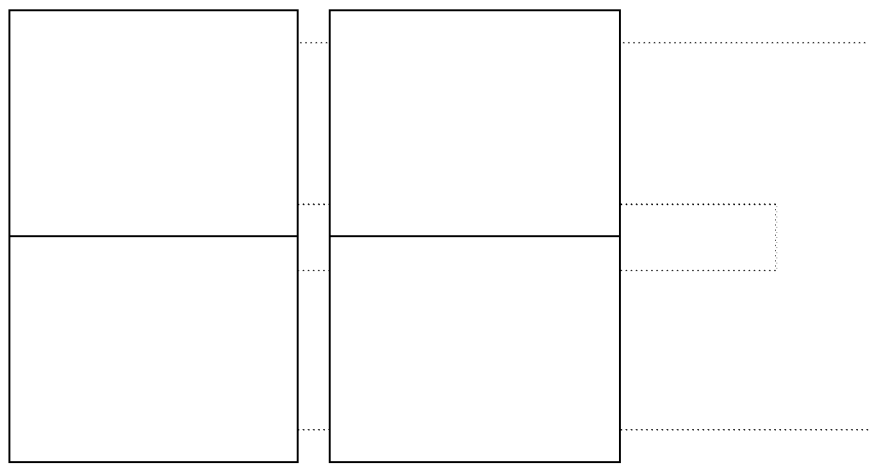
FIG. 6C

US 9,303,902 B2

THERMOELECTRIC ASSEMBLY

FIELD

The present disclosure generally relates to thermoelectric assemblies gaskets.

BACKGROUND

This section provides background information related to the present disclosure which is not necessarily prior art.

The Peltier effect is an effect in which a heat flux is created between the junction of two different types of materials. Thermoelectric modules (TEMs) are semiconductor devices which use the Peltier effect to transfer heat from one side of the TEM (the "cold side") to the other side of the TEM (the "hot side"). The TEM, a solid-state Peltier device, effectively acts as a heat pump upon the application of a DC power source to the TEM. Heat is moved through the TEM, from one side to the other, with consumption of electrical energy, depending on the direction of the current. Such an instrument may also be called a Peltier cooler or heater, a thermoelectric heat pump, a Peltier heat pump, a solid state refrigerator, a thermoelectric cooler (TEC), or a thermoelectric module (TEM). TEMs can be used either for heating or for cooling (refrigeration), although in practice the main application is cooling.

Thermoelectric assemblies (TEAs) often include a pair of fan sinks that face outwardly in opposite directions and meet at one or more TEMs at their bases. A TEA may comprise a cold side fan sink, a hot side fan sink, and a plurality of TEMs disposed between the fan sinks. A fan sink typically includes a fan mounted on or adjacent to a heat sink, often through the use of a fan housing over the heat sink fins. The TEA may also include a foam gasket that surrounds the TEMs. The TEMs may be arranged in a single circuit or a series of parallel circuits. The fan sinks may both be in thermal contact with the TEMs heat sink bases.

SUMMARY

This section provides a general summary of the disclosure, and is not a comprehensive disclosure of its full scope or all of its features.

In one aspect, a thermoelectric assembly has a cold side and a hot side. The boundary between the hot side and the cold side may be generally defined by a plane. One or more thermoelectric modules may be in the plane and arranged in one circuit or multiple parallel circuits, and in direct thermal contact with both the hot side and the cold side.

Both the hot side and the cold side each comprise a single fan sink, where a fan sink is a heat sink and a fan, each fan comprising a blade, and each heat sink comprising a fin set, where a fin set is a series of parallel protrusions on a heat sink base, the parallel protrusions aligned in a single exhaust direction. The heat sinks and the plane defined by the division between the hot side and the cold side may be sloped diagonally within the housing such that the entire thermoelectric assembly may be mounted entirely on one side of a surface, such as a vertical wall.

In an embodiment, each fan sink possesses an air intake direction defined by an axis about which the blade is rotatably attached to the fan. The air intake directions of the pair of fan sinks are parallel, opposing vectors.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 5 shows comparison test data of an embodiment of a thermoelectric assembly.

FIG. 6C shows eight thermoelectric modules of a thermoelectric assembly arranged in two parallel circuits of four series connected thermoelectric modules each.

DETAILED DESCRIPTION

Example embodiments will now be described more fully with reference to the accompanying drawings.

TEAs operate generally as follows: On the cold side, the fan pulls the surrounding air into the heat sink channels that are defined by the space between the heat sink fins, thereby drawing substantial ambient air over the cold side fins to facilitate an eventual air-to-metal thermal transfer on the cold side. The TEMs are in physical thermal contact with the bases of the heat sinks. The TEMs pump thermal energy from the cold side heat sink base onto the base of the hot side heat sink. As the hot side heat sink warms due to the heat pumped into them by the TEMs, the hot side fan cools the fins of the hot side heat sink by drawing ambient air across them and expelling warm air from the hot side air channels. In essence, the TEMs pump heat from one side of the unit to the other while the fan sinks provide substantial surface area and air flow therethrough to enable an efficient heat transfer.

Fan sinks are known mechanisms for forced air convection, which provides a more efficient air-to-metal or metal-to-air thermal transfer. Additionally, the forced convection mechanism aids in preventing oxidation of the heat sink material through the continuous movement of ambient air. Fan sinks include a particular fan and heat sink configuration, one where the axis about which the fan blade turns is directed perpendicularly towards the plane defined by the base of the heat sink, such that the ambient air is drawn down into the fin set towards its base and exhausted out either side of the fin set.

Thermoelectric modules are essentially solid state heat pumps comprising positively and negatively doped modules. They may be arranged in a single series circuit or in several parallel circuits, or any combination thereof. In non-limiting embodiments, for example where eight TEMs are present in the TEA, the TEMs may be arranged in four parallel circuits of two series connected TEMs, two parallel circuits of four series connected TEMs, or eight separate TEMs each on a single circuit.

As referred to herein, the terms hot side and cold side do not necessarily indicate one side as literally "hot" or "cold." Rather, an aim of the TEA disclosed herein is to transfer heat from the cold side to the hot side, thereby providing a relative cooling to the cold side. For example, a rooftop electrical service room with a TEA device installed would transfer heat from the warm inside to the potentially cooler ambient outside. Conversely, a TEA device installed on an indoor wine cooler or wine chiller that is colder than the surrounding ambient room temperature would be cooled by transferring heat from the cooler cold side to the warmer hot site. As such, the terms hot side and cold side are not intended to be limiting in the sense that the sides are literally hot or cold, but merely intended to show an embodiment of potential thermal flow of a TEA.

Figure 1A:
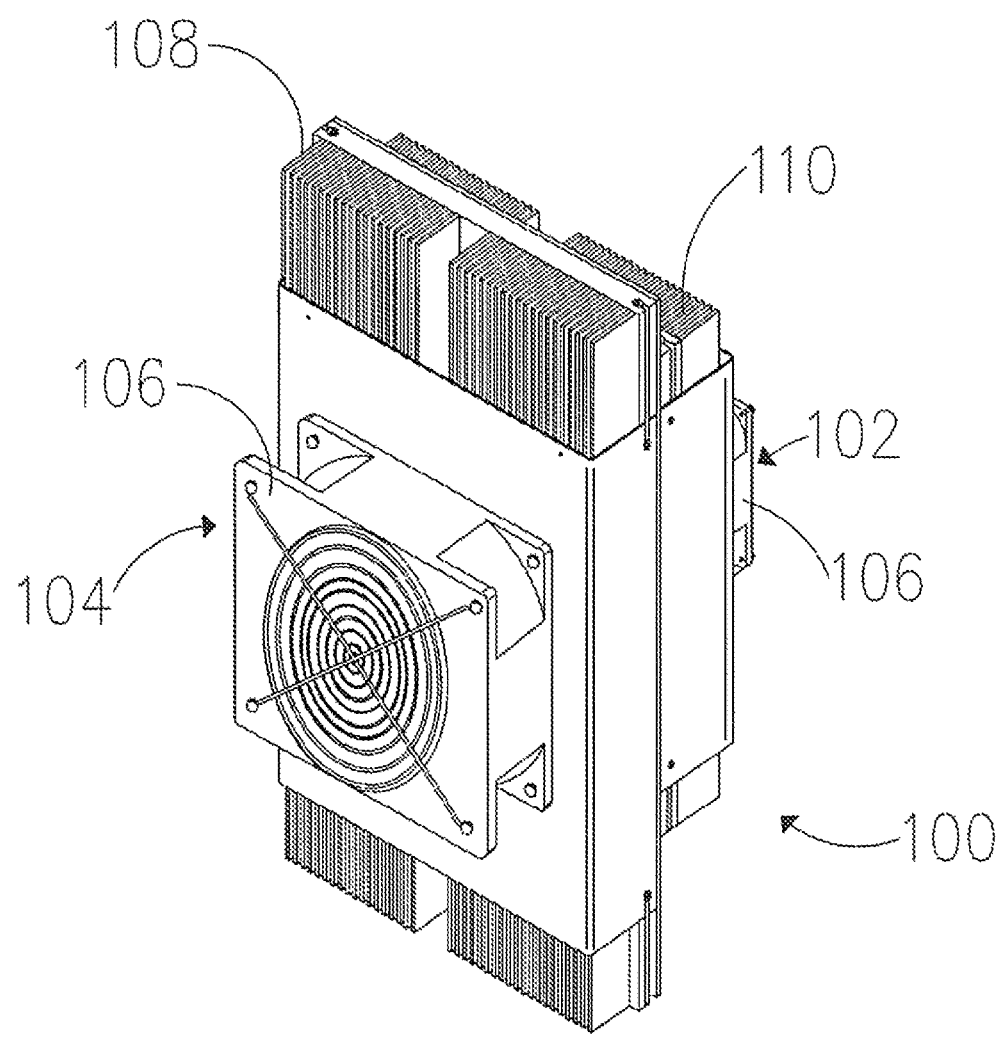
FIG. 1A shows a perspective view of one side of a conventional thermoelectric assembly.
Figure 1B:
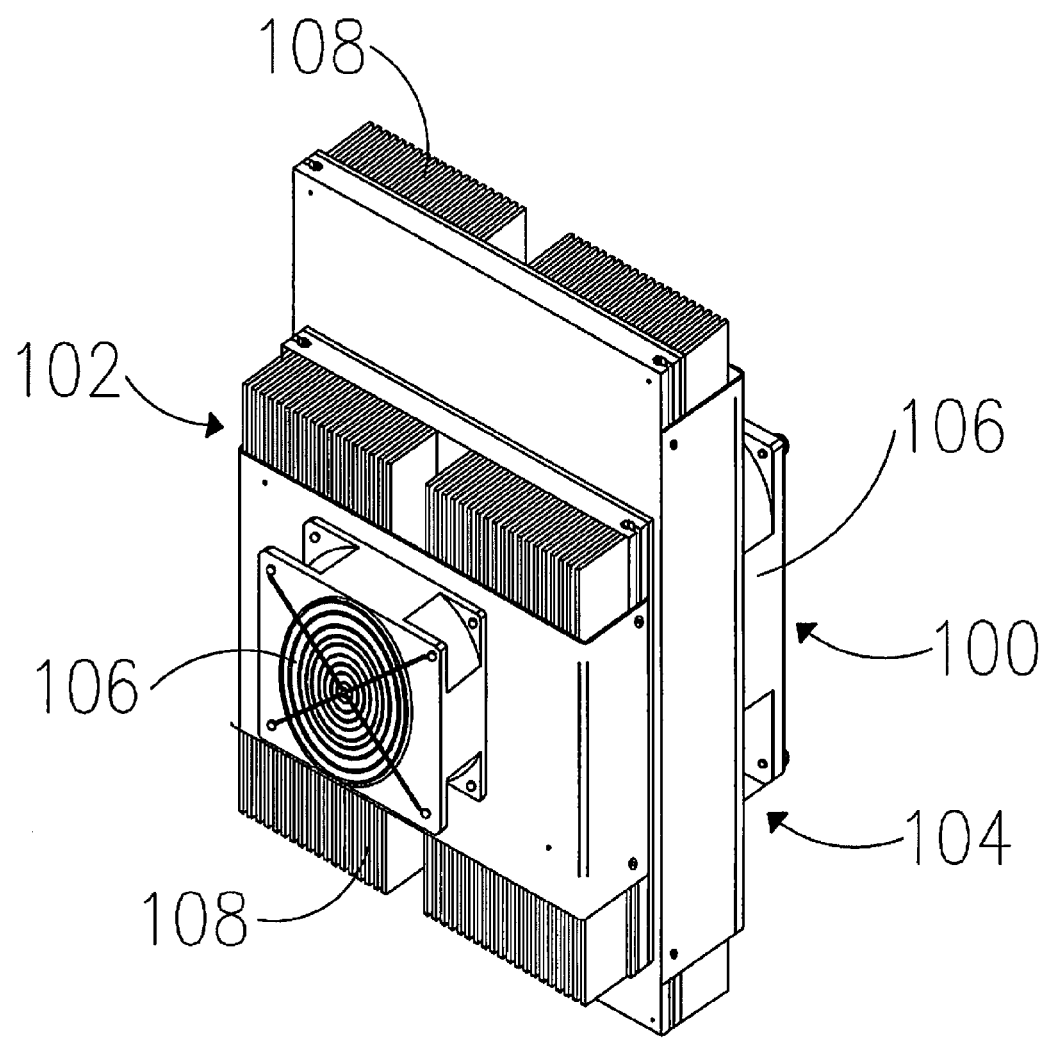
FIG. 1B shows a perspective view of the other side of the conventional thermoelectric assembly shown in FIG. 1A.

Referring to the figures, a TEA 100 of the prior art can be seen in FIGS. 1A and 1B. Both the hot side and cold side fan sinks 102, 104 of this TEA include a heat sink 108 and fan 106, where the fan air intake direction is perpendicular to the base of the heat sink. Additionally, the two fan air intake directions may be represented as opposing vectors. The heat sink bases meet at a plane wherein TEMs reside in direct thermal contact with both heat sinks.

Figure 1C:
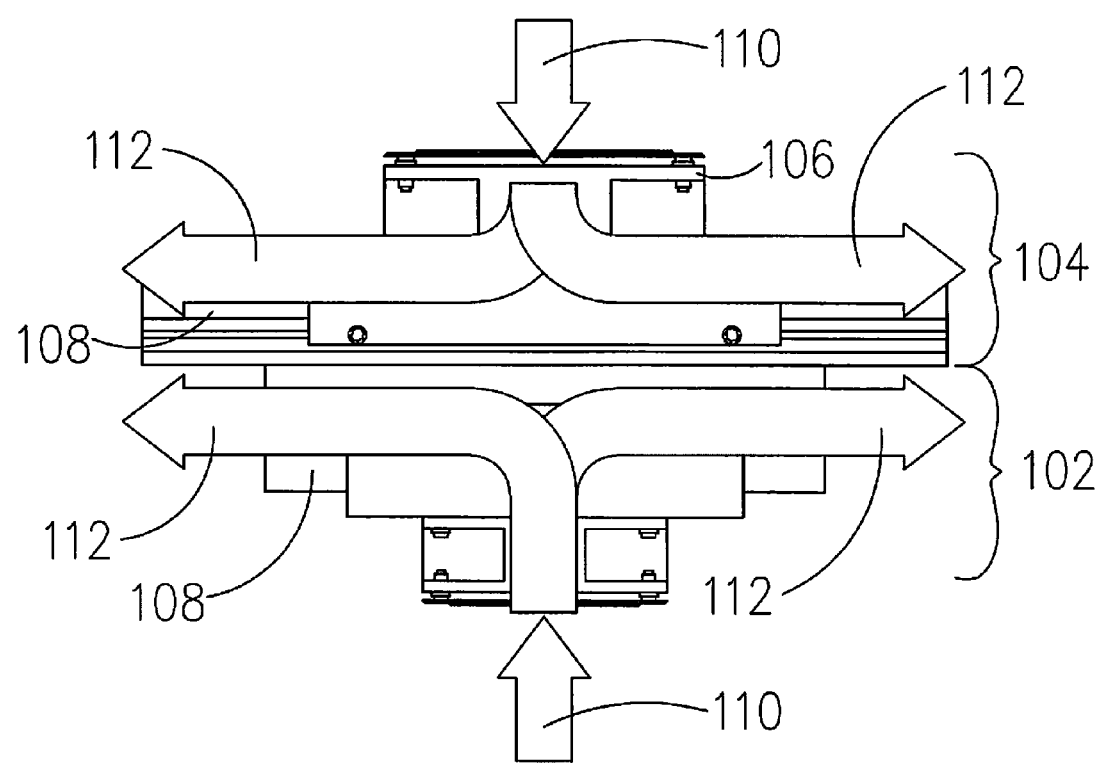
FIG. 1C shows an air flow diagram of an embodiment of the conventional thermoelectric assembly shown in FIGS. 1A and 1B.

As seen in the two-dimensional side view air flow diagram of FIG. 1C, the air intake directions 110 are perpendicular to the plane and exhaust directions 112 and together make a generally cross shape. Both the hot side 102 and cold side 104 of the TEA 100 include a single air intake direction 110 and a pair of air exhaust directions 112, as the air flows out through the fins of the respective heat sinks 108 in two opposing directions.

The TEA of FIGS. 1A, 1B, and 1C, when mounted on a vertical surface such as a wall, necessarily takes up space on both sides of the vertical surface to allow air exhaust on each side of the surface.

Figure 2A:
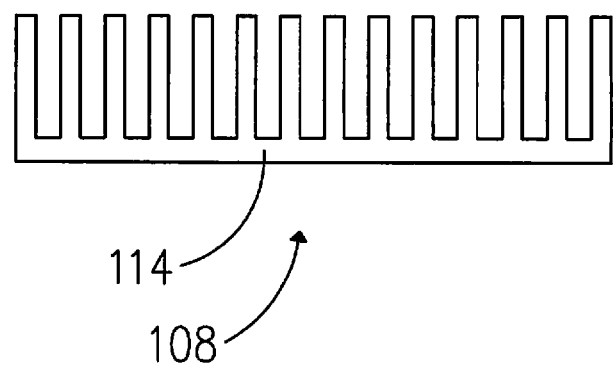
FIG. 2A shows a cross sectional example of a single piece heat sink.

Though heat sinks are not so limited in shape, heat sinks suitable for use in TEAs generally comprise a rectangular base upon which a series of fins, referred to as a fin set, protrude. Fins may be substantially parallel panels of material, often the same material as the base. Two exemplary types of heat sinks 108 can be seen in FIGS. 2A and 2B. FIG. 2A shows a cross section of a single piece heat sink 114. Conversely, FIG. 2B shows a cross section of a multi-piece heat sink, where the multi-piece heat sink comprises a series of fins 118 that have been mounted on a base 116.

As seen in FIG. 2A, a heat sink 108 may be a block of metal, such as copper or anodized aluminum, or thermoelectric material, such as thermally-conductive polymer composites, that has, for example, been skived, molded, or extruded to create a series of parallel ribs on a base. In certain instances, such as where the desired rib height is substantial enough that skiving of the entire heat sink is in appropriate, a heat sink base may be constructed of a skived, extruded, or molded base, whereupon individual fins are mounted within the skived recesses of the heat sink base, as seen in FIG. 2B.

Figure 2B:
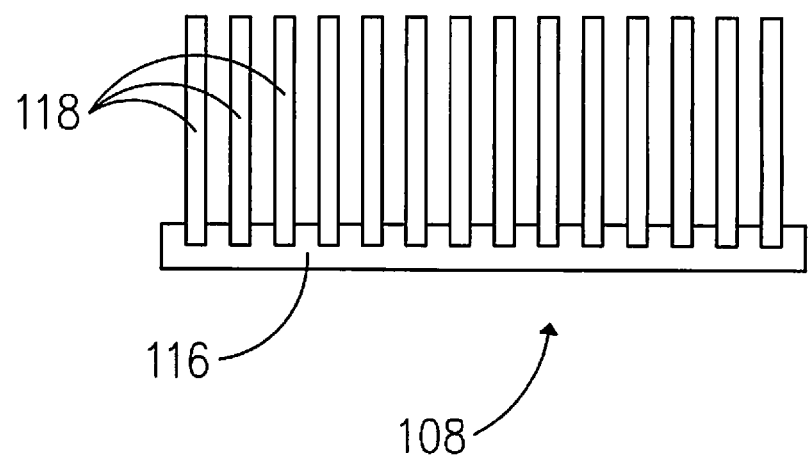
FIG. 2B shows a cross sectional example of a multi-piece heat sink.

Due to the presence of adhesive or other bonding material in the heat sinks of FIG. 2B, this being necessary to adhere the individual fins to the base, it is known in the art that a single piece heat sink, such as that of FIG. 2A, provides more efficient thermal transfer through the heat sink.

In an embodiment where the heat sink is comprised of a thermally-conductive polymer composite, the heat sink may be made through injection molding or thermoset molding. A multi-piece heat sink may be needed if, for example, an application requires fins of such a depth that skiving is not practical. In either case, the fan sinks of a TEA may be suitable for either a single piece heat sink or a multi-piece heat sink.

In an embodiment, the thermoelectric assembly has both a hot side and a cold side, where the boundary between the hot side and the cold side may be generally defined by a plane. One or more thermoelectric modules may be in the plane and arranged in one circuit or multiple parallel circuits, and in direct thermal contact with both the hot side and the cold side.

A fan sink generally includes a heat sink and a fan. Each fan has a blade that rotates about an axis. The fan is mounted on or near a heat sink and pulls air through each fan and onto and through the heat sink fin set. The air flows into the heat sink channels that are defined by the space between the heat sink fins. Each fan sink possesses an air intake direction that may be defined by the axis about which the blade is rotatably attached to the fan. Similarly, each fan sink comprises an exhaust direction that, in the prior art, may be perpendicular to the intake direction and generally parallel to the linear arrangement of the fin set.

Figure 3:
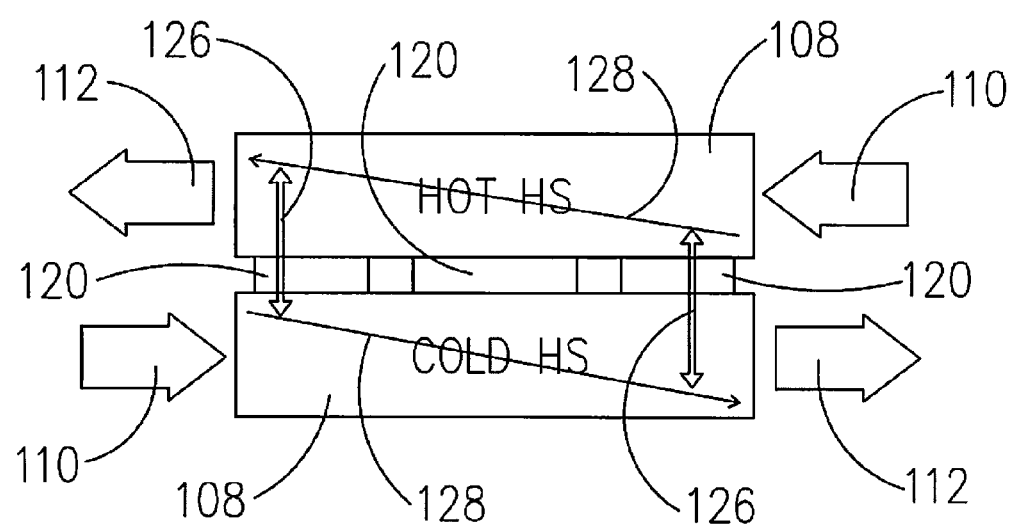
FIG. 3 shows a temperature gradient diagram of an embodiment of a thermoelectric assembly.

FIG. 3 shows a temperature gradient diagram of an embodiment of a thermoelectric assembly. The black arrows 128 in FIG. 3 represent the temperature gradient of the respective heat sinks 108, which meet at their bases at a series of TEMs 120. Both the hot side and cold side of the TEA have a single air intake direction 110 and a single air exhaust direction 112. On each side, the air flows through the heat sink 108 in a single direction aligned with the heat sink fins. As can be seen in FIG. 3, the air flow between the two heat sinks are generally opposite directions, giving a consistent temperature gradient between the two sides, as represented by the double arrows 126. Thus, the temperature gradient between the hot side heat sink and the cold side heat sink remains substantially constant throughout the direction of air flow through the heat sink fins.

For the hot side heat sink in this embodiment seen in FIG. 3, the temperature gradient increases as air travels from right to left in the hot side exhaust direction. For the cold side heat sink in this embodiment, the temperature gradient decreases as air travels from left to right in the cold side exhaust direction. The dual ended arrows 126 between the black arrows 128 indicate that the temperature difference between the hot side and cold side throughout the thermoelectric assembly remains approximately the same. Having each thermoelectric module within the thermoelectric assembly thusly operating at approximately the same level is beneficial from a performance point of view.

Figure 4A:
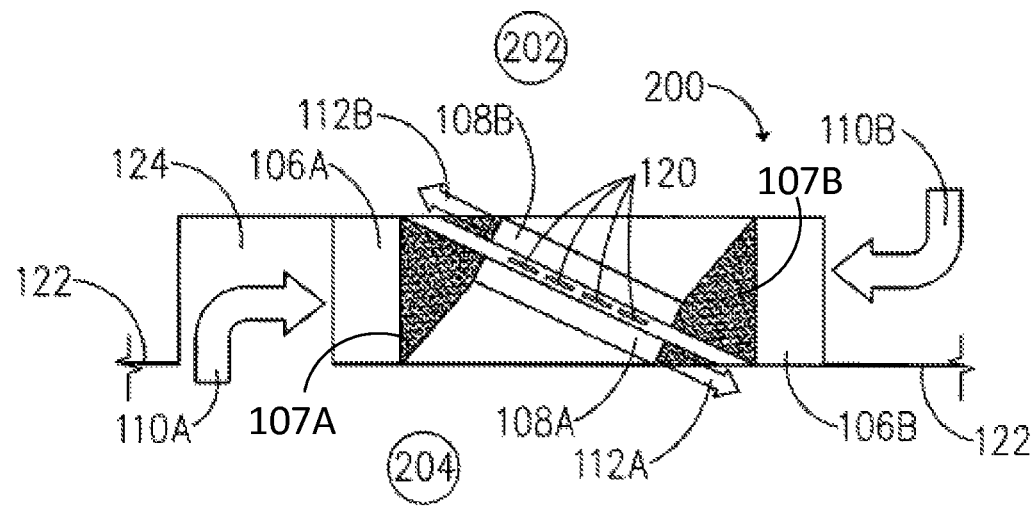
FIG. 4A shows an air flow diagram of an embodiment of a thermoelectric assembly mounted on a surface, this diagram showing the assembly mounted outside the cavity to be cooled by the assembly.
Figure 4B:
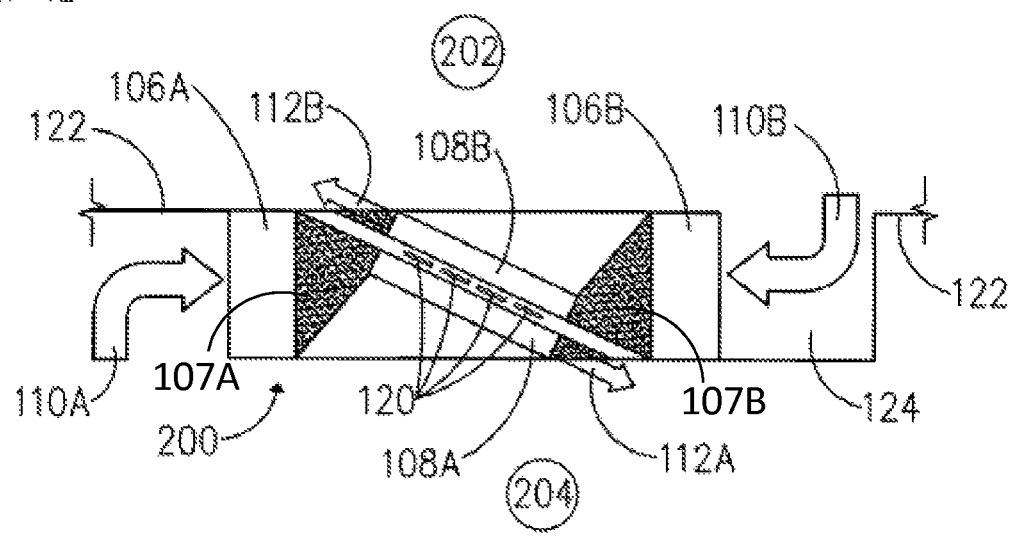
FIG. 4B shows an air flow diagram of an embodiment of a thermoelectric assembly mounted on a surface, this diagram showing the assembly mounted inside the cavity to be cooled by the assembly.
Figure 6A:
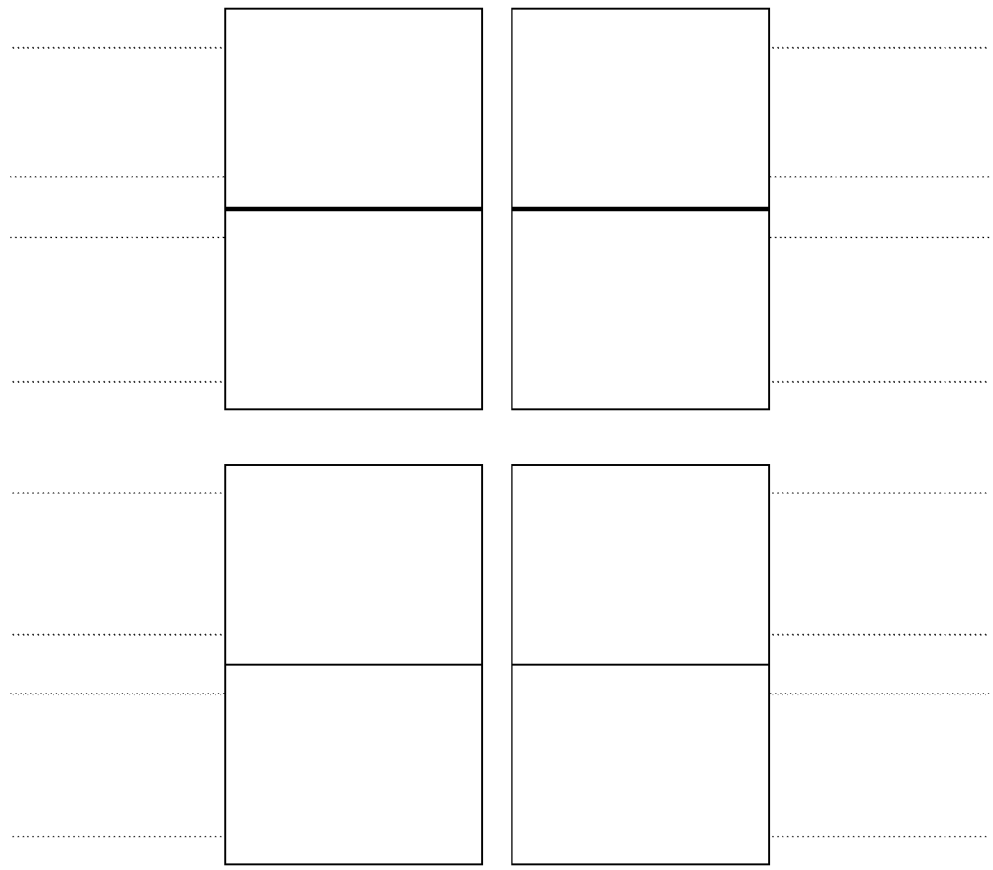
FIG. 6A shows eight thermoelectric modules of a thermoelectric assembly arranged in eight parallel circuits of one thermoelectric module each.
Figure 6B:
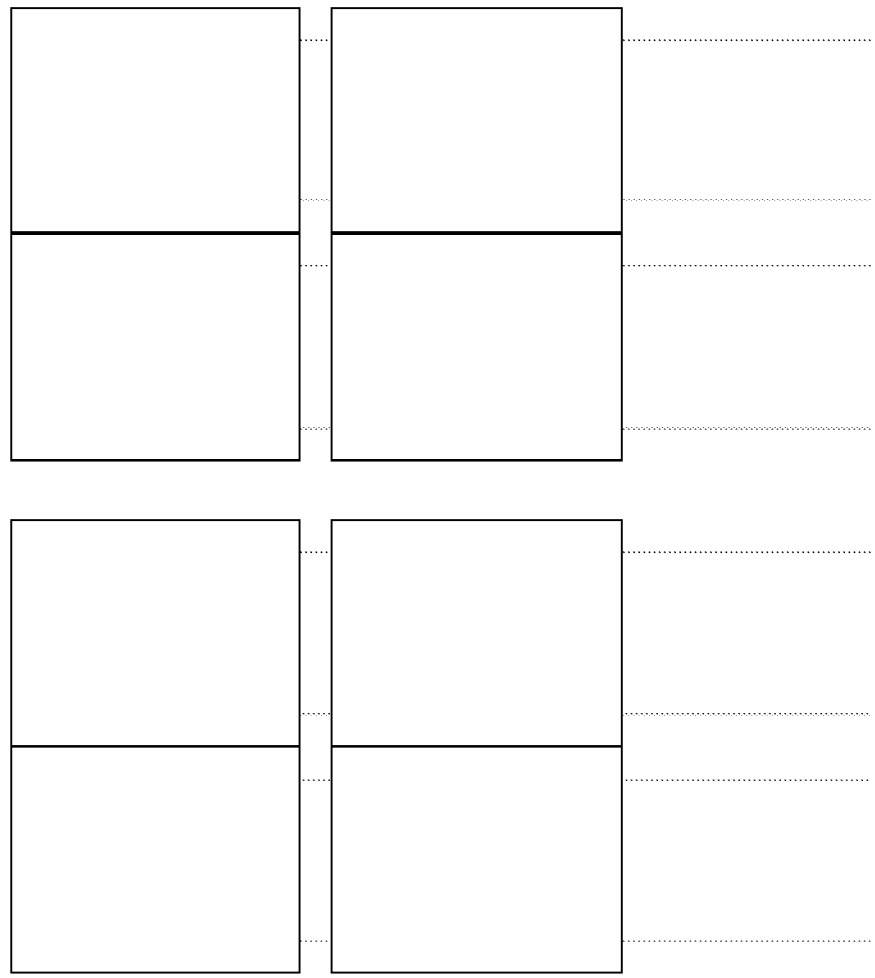
FIG. 6B shows eight thermoelectric modules of a thermoelectric assembly arranged in four parallel circuits of two series connected thermoelectric modules each.

In the conventional TEAs shown in FIGS. 1A, 1B, and 1C, the air intake direction is perpendicular with the plane, whereas the air intake directions of the embodiment of a TEA shown in FIGS. 4A and 4B are non-perpendicular with respect to the plane. The internal walls of the embodiment of the thermoelectric assembly as seen in FIGS. 4A and 4B are configured to direct and focus the air intake of each of the fans in a single direction through the respective fin sets, resulting in the air flow diagrams seen in FIGS. 4A and 4B.

The thermoelectric assembly of FIGS. 4A and 4B includes both a cold side 204 and a hot side 202, where a boundary between the hot side and the cold side is generally defined by a plane within which the TEMs reside 120 in direct thermal contact with both heat sinks 108A, 108B. Each fan sink has a heat sink 108 and a fan 106, each fan having a blade, and each heat sink including a heat sink base and a fin set disposed on the heat sink base. A fin set is a plurality of substantially parallel planar fins, the fins being aligned in an exhaust direction 112, the exhaust direction being parallel to the plane. The assembly further includes a plurality of thermoelectric modules 120, the thermoelectric modules being arranged in at least one electrical circuit, with each thermoelectric module being in thermal contact with the heat sink bases of both the hot side and the cold side.

The plane that separates the cold side from the heat side is sloped within the thermoelectric assembly for spatial considerations, rather than due to any particular performance data. Thus, the exact degree that the plane has been sloped is determined only by how best the TEMs and any related insulating foam gasket, as well as the fan sinks, fit in the TEA's particular housing.

Referring to FIGS. 4A and 4B, which additionally show air flow diagrams of embodiments of the thermoelectric assemblies, the assembly 200 has been mounted on a wall, panel, or other flat surface 122 of an enclosure to be cooled 204, separating it from the exterior 202. In this way, the exterior 202 is the hot side, and the interior 204 is the cold side.

The hot side exhaust direction 112B and the cold side exhaust direction 112A are parallel vectors in opposite directions. The hot side air intake direction 110B and the cold side air intake directions 110A are parallel opposing vectors. The cold side air drawn into the TEA 200 by the cold side fan 106A is directed linearly through the cold side heat sink 108A and respective fin set, entering on one side of the fin set and exiting the other as exhaust 112A. Analogously, the hot side air drawn into the TEA 200 by the hot side fan 106B is directed linearly through the hot side heat sink 108B and respective fin set, entering on one side of the fin set and exiting the other as exhaust 112B.

In FIGS. 4A and 4B, on both the hot side 202 and cold side 204, air drawn through the air intake directions 110A, 110B through the respective fans 106A, 106B may be focused into the respective heat sinks 108A, 108B by adding additional structure, housing, or other means to the TEA 200. An embodiment of that focusing is represented by the shaded quadrilateral areas 107A, 107B in those figures through which air flows from the fans 106A, 106B may be focused into the respective heat sinks 108A, 108B. The shaded triangular areas in FIGS. 4A and 4B represent an area of the TEA 200 where exhausted air transitions out of the TEA 200 as exhaust. Thus, an exemplary thermoelectric assembly may have a pair of focusing structures 107A, 107B between the fans 106A, 106B and the heat sinks 108A, 108B, respectively, wherein the focusing structure 107A, 107B directs air flow from the corresponding fan 106A, 106B into the fin set of the corresponding heat sink 108A, 108B, where each of the hot side and the cold side has a focusing structure.

FIG. 4A shows an air flow diagram of an embodiment of a thermoelectric assembly 200 mounted on a surface 122, this diagram showing the assembly mounted outside the cavity to be cooled 204 by the assembly 200. In order to direct air to be cooled into the cold side fan 106A, a pocket 124 of structure or housing has been added to the assembly 200, into which the air to be cooled is drawn via the air intake direction 110A.

Conversely, FIG. 4B shows an air flow diagram of an embodiment of a thermoelectric assembly 200 mounted on a surface 122, this diagram showing the assembly mounted inside the cavity to be cooled 204 by the assembly. In order to direct ambient external air into the hot side fan 106B, a pocket 124 of structure or housing has been added to the assembly 200, into which the air to be cooled is drawn via the air intake direction 110B.

The mounting mechanisms seen in FIGS. 4A and 4B are distinct from and advantageous to that of the conventional TEA seen in FIGS. 1A, 1B and 1C.

In each of FIGS. 4A and 4B, hot internal air is drawn into the TEA from the cavity to be cooled and returned as cooled internal air. Further, cool ambient air is drawn from outside the cavity to be cooled and dissipated to the exterior ambient.

FIG. 5 shows comparison test data of an embodiment of a thermoelectric assembly. The y axis of FIG. 5 shows the cooling power (Pc) in watts, and the x axis represents the cooling difference between the hot side and cold side ($\Delta T$) in degrees. Plot line A shows the performance data for a convention TEA such as that seen in FIGS. 1A and 1B. Plot line B shows the performance data for an embodiment of the TEA of FIGS. 4A and 4B where the heat sinks are skived or molded as seen in FIG. 2A. Plot line C shows the performance data for an embodiment of the TEA of FIGS. 4A and 4B, where the heat sinks are multi-piece heat sinks as seen in FIG. 2B.

Reviewing the data plots in FIG. 5, the TEA of FIGS. 4A and 4B has comparable performance with a prior art TEA at LOWER $\Delta T$, and the performance of the TEA of FIGS. 4A and 4B fails to match that of the prior art as the $\Delta T$ increases. For certain applications, such as where a great deal of cooling is required, the TEA of FIGS. 4A and 4B may not be an appropriate cooling option. However, where spatial considerations require the TEA to be mounted entirely internally or externally on a given surface, and where the temperature demands are not significant, such as in a server rack, the TEA of FIGS. 4A and 4B may be an appropriate cooling option.

The TEA may further comprise electrical wiring such that the TEMs, as previously discussed, are in one or more parallel circuits, and sufficient to power the fans. The TEMs, once sufficient voltage is applied, will pump heat from the cold side heat sink bases to the hot side heat sink base. A typical thermoelectric module includes an upper substrate and a lower substrate oriented generally parallel to one another, as well as a positive and negative lead wire attached thereto. A TEM includes alternating N-type and P-type thermoelectric elements disposed generally between the upper and lower substrates, these elements are formed from suitable materials, such as bismuth telluride for example. Frequently the upper and lower substrates are rectangular in shape, though other shapes may be suitable.

As stated herein, a TEM is considered in direct thermal contact with a heat sink base where a substrate is flush against the base of a heat sink. Frequently the entire surface areas of each substrate of the TEM are covered by a heat sink base to provide optimal thermal transfer. In this manner, the TEMs are sandwiched between two heat sinks, and surrounded by thermally insulating material. It should be understood by one of skill in the art that a TEM and heat sink may be considered in direct thermal contact even in the presence of thermal grease or paste or other thermal interface material. Such paste may be, just for example, aluminum oxide particles, or zinc oxide particles, in a silicone carrier.

The hot side/cold side thermal flow could be reversed in a TEA by merely reversing the current in the TEM circuits, thereby altering the TEM heat flow. The assembly disclosed herein may include a switch that reverses the current of the TEMs without the need to rewire the assembly or the power source into the assembly. Such a reversal of current, however, may not result in equal thermal transfer efficiency in each direction, given variables such as the size, shape, and configuration of the respective heat sinks, as well as other factors.

The method of cooling an enclosure using an embodiment of a thermoelectric assembly may include the steps of directing ambient air from outside the enclosure through the hot side heat sink fin set in a first direction and directing ambient air from within the enclosure through the cold side heat sink set in a second direction. In this method, the first direction and the second direction are opposing parallel vectors.

The method may include the use of a TEA with a fan on the hot side and the fan on the cold side, each fan having an air intake direction, and may further include the steps of directing ambient air from outside the enclosure in an air intake direction through the hot side heat sink fin set in a first direction through the use of the hot side fan, and directing ambient air from within the enclosure in an air intake direction through the cold side heat sink set in a second direction through the use of the hot side fan.

The method may additionally include focusing the ambient air from outside the enclosure from the hot side fan into the hot side heat sink, and focusing the ambient air from within the enclosure from the cold side fan into the cold side heat sink. Further, when the thermoelectric assembly has been mounted entirely within the cavity to be cooled, the assembly may include a pocket, the pocket being a structure formed into a cavity into which air may be drawn from outside the enclosure in an air intake direction. Conversely, when the thermoelectric assembly has been mounted entirely outside of the cavity to be cooled, the assembly further includes a pocket, the pocket being a structure formed into a cavity into which air may be drawn from within the enclosure in an air intake direction.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally," "about," and "substantially," may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A thermoelectric assembly comprising:
a cold side and a hot side, where the boundary between the hot side and the cold side is generally defined by a plane;
a heat sink on each of the hot side and the cold side, each heat sink comprising a heat sink base and a fin set disposed on the heat sink base, each fin set comprising a plurality of substantially parallel planar fins, the fins being aligned in a single exhaust direction that is parallel to the plane, the heat sinks meeting at their respective bases at the plane; a plurality of thermoelectric modules, the thermoelectric modules being arranged in at least one electrical circuit, with each thermoelectric module residing in the plane and being in thermal contact with the heat sinks of both the hot side and the cold side; and
a fan and focusing structure on each of the hot side and cold side, each fan having an air intake direction, the focusing structure located between the fan and the heat sink on the respective hot side and cold side for focusing air from the fan into the fin set of the sink on corresponding hot and cold side;
wherein the air intake direction of the fan on the cold side and the air intake direction of the fan on the hot side are parallel opposing vectors,
wherein the single hot side exhaust direction and the single cold side exhaust direction are opposing parallel vectors,
wherein the heat sinks on the hot and cold side and the plane are sloped diagonally within the housing such that the thermoelectric assembly is mountable on a surface of an enclosure to be cooled to thereby separate an interior of the enclosure from an exterior of the enclosure whereby the exterior is the hot side and the interior is the cold side.

2. The thermoelectric assembly of claim 1, wherein both the hot side air intake direction and the cold side air intake direction are non-perpendicular with respect to the plane.

3. The thermoelectric assembly of claim 1, wherein the focusing structure comprises a plurality if internal walls of the housing for focusing air from the fan into the fin set of the heat sink on each of the hot side and cold side.

4. The thermoelectric assembly of claim 1, wherein the thermoelectric assembly is mountable on a single side of a flat surface of the enclosure to be cooled.

5. The thermoelectric assembly of claim 1, further comprising a single pocket, the single pocket being a structure formed into a cavity to be cooled into which air is drawn in an air intake direction.

6. The thermoelectric assembly of claim 1, wherein the heat sinks comprise a material selected from the group consisting of a thermoplastic, anodized aluminum, or copper.

7. The thermoelectric assembly of claim 1, wherein the temperature gradient between the hot side heat sink and the cold side heat sink remains substantially constant throughout a direction of air flow.

8. The thermoelectric assembly of claim 1, wherein:
both the hot side air intake direction and the cold side air intake direction are non-perpendicular with respect to the plane; and
the assembly further comprises a single pocket, the single pocket being a structure formed into a cavity to be cooled into which air is drawn in an air intake direction.

9. The thermoelectric assembly of claim 8, wherein the assembly is mountable on a single side of a flat surface of the cavity to be cooled such that the thermoelectric assembly is mounted entirely inside of or entirely outside of the cavity to be cooled.

10. The thermoelectric assembly of claim 1, wherein the focusing structure includes internal walls configured to direct and focus air intake of each of the fans on the cold and hot sides into the respective fin set of the corresponding cold and hot side heat sinks.

11. The thermoelectric assembly of claim 1, wherein:
both the hot side air intake direction and the cold side air intake direction are non-perpendicular with respect to the plane; and a temperature gradient between the hot side heat sink and the cold side heat sink remains substantially constant throughout a direction of air flow through the heat sink fins.

12. The thermoelectric assembly of claim 1, wherein:
a temperature gradient increases for the hot side heat sink as air travels in the hot side exhaust direction;
a temperature gradient decreases for the cold side heat sink as air travels in the cold side exhaust direction; and
whereby a temperature difference between the hot side and cold side throughout the thermoelectric assembly remains substantially constant.

13. A thermoelectric assembly comprising:
a cold side and a hot side, where the boundary between the hot side and the cold side is generally defined by a plane;
a heat sink on each of the hot side and the cold side, each heat sink comprising a heat sink base and a fin set disposed on the heat sink base, each fin set comprising a plurality of substantially parallel planar fins, the fins being aligned in a single exhaust direction that is parallel to the plane, the heat sinks meeting at their respective bases at the plane;
a plurality of thermoelectric modules, the thermoelectric modules being arranged in at least one electrical circuit, with each thermoelectric module residing in the plane and being in thermal contact with the heat sinks of both the hot side and the cold side;
and a fan and a focusing structure on each of the hot side and cold side, each fan having an air intake direction, the focusing structure located between the fan and the heat sink on the respective hot side and cold side for focusing air from the fan into the fin set of the sink on corresponding hot and cold side;

wherein the air intake direction of the fan on the cold side and the air intake direction of the fan on the hot side are substantially parallel opposing vectors, and wherein the single hot side exhaust direction and the single cold side exhaust direction are opposing parallel vectors, and wherein the assembly comprises eight thermoelectric modules, the thermoelectric modules being arranged in a one of a plurality of parallel circuits selected from the group consisting of eight parallel circuits of one thermoelectric module each, four parallel circuits of two series connected thermoelectric modules each, and two parallel circuits of four series connected thermoelectric modules each, wherein the plurality of thermoelectric modules are arranged in a plurality of parallel circuits of one thermoelectric module each or wherein the plurality of thermoelectric modules are arranged in two or more parallel circuits of two or more series connected thermal electric modules each;

wherein the heat sinks on the hot and cold side and the plane are sloped diagonally within the housing such that the thermoelectric assembly is mountable on a surface of an elclosure to be cooled to thereby separate an interior of the enclosure from an exterior of the enclosure whereby the exterior is the hot side and the interior is the cold side.

14. A method of cooling an enclosure comprising:

providing a thermoelectric assembly mounted on a planar surface of an enclosure, the assembly having a hot side and a cold side, where a boundary between the hot side and the cold side is generally defined by a plane, the assembly further comprising a heat sink, a fan, and a focusing structure on each of the hot side and cold side, each heat sink comprising a heat sink base and a fin set disposed on the heat sink base, each fin set comprising a plurality of substantially parallel planar fins, the fins being aligned in a single direction, the heat sinks meeting at their respective bases at the plane, the focusing structure being located between the fan and the heat sink on the respective hot side and cold side, the heat sinks on the hot side and the cold side and the plane being sloped diagonally within a housing such that an interior of the enclosure is separated from an exterior of the enclosure whereby the exterior is the hot side and the interior is the cold side, the assembly further comprising a plurality of thermoelectric modules, the thermoelectric modules being arranged in at least one electrical circuit, with each thermoelectric module residing in the plane and being in thermal contact with the heat sinks of both the hot side and the cold side;

directing ambient air from outside the enclosure through the hot side heat sink fin set in a first direction;

directing ambient air from within the enclosure through the cold side heat sink set in a second direction, and focusing air from the fan into the fin and arranging the heat sinks on the hot and cold side and the plane in a sloped diagonal position within the housing such that the thermoelectric assembly is mountable on a surface of an enclosure to be cooled to thereby separate an interior of the enclosure from an exterior of the enclosure whereby the exterior is the hot side and the interior is the cold side of the heat sink on the corresponding hot and cold side by the focusing structure;

wherein the first direction and the second direction are opposing parallel vectors.

15. The method of claim 14, wherein:

each fan having an air intake direction; and the method further comprises: directing ambient air from outside the enclosure in the air intake direction of the hot side fan through the hot side heat sink fin set in the first direction through the use of the hot side fan; and directing ambient air from within the enclosure in the air intake direction of the cold side fan through the cold side heat sink set in the second direction through the use of the cold side fan.

16. The method of claim 15, further comprises: focusing the ambient air from outside the enclosure from the hot side fan into the hot side heat sink; and focusing the ambient air from within the enclosure from the cold side fan into the cold side heat sink.

17. The method of claim 14, wherein the thermoelectric assembly has been mounted entirely within a cavity to be cooled, the assembly further comprising a pocket, the pocket being a structure formed into the cavity into which air is drawn from outside the enclosure in an air intake direction.

18. The method of claim 14, wherein the thermoelectric assembly has been mounted entirely outside of a cavity to be cooled, the assembly further comprising a pocket, the pocket being a structure formed into the cavity into which air is drawn from within the enclosure in an air intake direction.

19. The method of claim 14, wherein:

the fan on the hot side has an air intake direction non-perpendicular with respect to the plane, and the fan on the cold side having an air intake direction non-perpendicular with respect to the plane;

the method includes using the fan on the hot side for directing ambient air from outside the enclosure through the hot side heat sink fin set, and using the fan on the cold side for directing ambient air from within the enclosure through the cold side heat sink set; and a temperature gradient between the hot side heat sink and the cold side heat sink remains constant throughout the direction of air flow through a heat sink fins.

* * * * *